(12) United States Patent
Six

(10) Patent No.: US 8,564,925 B2
(45) Date of Patent: Oct. 22, 2013

(54) WAFER CHUCK FOR EUV LITHOGRAPHY

(75) Inventor: Stephan Six, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 20 days.

(21) Appl. No.: 13/163,100

(22) Filed: Jun. 17, 2011

(65) Prior Publication Data

US 2011/0310524 A1   Dec. 22, 2011

Related U.S. Application Data

(63) Continuation of application No. PCT/EP2009/008749, filed on Dec. 8, 2009.

(30) Foreign Application Priority Data

Dec. 19, 2008  (DE) .................. 10 2008 054 982

(51) Int. Cl.
*H02N 13/00*  (2006.01)

(52) U.S. Cl.
USPC ........................................ 361/234

(58) Field of Classification Search
USPC ........................................ 361/234
See application file for complete search history.

(56) References Cited

U.S. PATENT DOCUMENTS

| 2,858,240 | A | | 10/1958 | Turner et al. | |
|---|---|---|---|---|---|
| 5,936,307 | A | | 8/1999 | Schonauer et al. | |
| 6,150,186 | A | * | 11/2000 | Chen et al. | 438/14 |
| 7,220,319 | B2 | | 5/2007 | Sago et al. | |
| 7,358,152 | B2 | * | 4/2008 | Kub et al. | 438/459 |
| 2003/0222416 | A1 | | 12/2003 | Sago et al. | |
| 2004/0067420 | A1 | * | 4/2004 | Ota | 430/5 |
| 2005/0099758 | A1 | * | 5/2005 | Kellerman et al. | 361/234 |
| 2006/0199353 | A1 | * | 9/2006 | Kub et al. | 438/455 |
| 2008/0153010 | A1 | | 6/2008 | Sugiyama | |
| 2008/0166534 | A1 | | 7/2008 | Yoshino | |
| 2008/0231992 | A1 | | 9/2008 | Cheng et al. | |
| 2009/0086180 | A1 | * | 4/2009 | Ottens et al. | 355/53 |
| 2010/0026331 | A1 | * | 2/2010 | Chong et al. | 324/757 |
| 2011/0310524 | A1 | * | 12/2011 | Six | 361/234 |

FOREIGN PATENT DOCUMENTS

| CN | 1472037 | A | 2/2004 |
|---|---|---|---|
| EP | 1406121 | A1 | 4/2004 |
| JP | 61091354 | A | 5/1986 |
| JP | 2001223261 | A | 8/2001 |
| JP | 2003-309168 | A | 10/2003 |
| JP | 2006066857 | A | 3/2006 |

* cited by examiner

*Primary Examiner* — Ronald W Leja
(74) *Attorney, Agent, or Firm* — Sughrue Mion, PLLC

(57) ABSTRACT

A wafer chuck (1*b*) having a substrate (2) and having, applied to the substrate (2), an electrically conductive coating (8) for fixing a wafer (6) by electrostatic attraction and preferably having a reflective coating (10) applied to the substrate (2). The coating (8; 10) has at least a first layer (3; 11) under compressive stress and at least a second layer (7; 12) under tensile stress for compensating for the compressive stress of the first layer (3; 11) in order to keep deformation of the wafer chuck (1*b*) by the coating (8, 10) as low as possible.

28 Claims, 2 Drawing Sheets

WAFER CHUCK FOR EUV LITHOGRAPHY

This is a Continuation of International Application PCT/EP2009/008749, with an international filing date of Dec. 8, 2009, which was published under PCT Article 21(2) in German, and which claims priority to German patent Application No. 10 2008 054 982.7. The entire disclosures of both applications are incorporated into this application by reference.

FIELD OF AND BACKGROUND OF THE INVENTION

The invention relates to a wafer chuck having a substrate and having, applied to the substrate, an electrically conductive coating for fixing a wafer by electrostatic attraction and preferably having a reflective coating applied to the substrate.

In order to hold plate-like objects that are in the form of wafers, use is made of wafer chucks which position, or fix, the wafers in a suitable manner. In EUV lithography, the wafer and the wafer chuck are typically in a vacuum environment of an EUV lithography system. The wafer is typically attached to a likewise plate-shaped holder which is referred to as a wafer table. The wafer, together with the wafer table, is fixed to the upper side of the wafer chuck by electrostatic attraction. The upper side of the wafer chuck is for that purpose provided with an electrically conductive coating which acts as an electrode and which may be composed, for example, of a layer of chromium. An electrically conductive coating is here understood to mean a coating having at least one conductive layer which is electrically contactable in order to fix the wafer by electrostatic attraction. Optionally other layers which are non-conductive or only weakly conductive may be applied above or below that layer. It will be appreciated, however, that it is also possible for the entire coating to be made up of conductive layer materials.

In order further to enhance the properties of the coating with regard to their scratch resistance, it was proposed to use coating materials that had a greater coefficient of friction and a greater material hardness than chromium. Those materials are typically applied by sputter coating or by an ion-assisted process which as a rule leads to layers that have very high mechanical compressive stresses of up to a few GPa. Under the influence of those high mechanical layer stresses, the wafer chuck may become deformed which, in an extreme case, may lead to the requirements in respect of the evenness of the wafer substrate no longer being fulfilled.

Although an attempt can be made to prevent the occurrence of excessive deformation by applying the coating with as small as possible a layer thickness, the problem arises that the layer applied should not be less than a minimum of approximately 100 nm thick in order not to exceed the maximum surface resistance allowed in the case of the present applications of typically from 100 Ohm to 200 Ohm.

In addition to the electrically conductive coating, it is possible to apply, for example, to the side faces of the substrate, a reflective coating which can be used for the exact positioning of the wafer chuck, for example, with the aid of a laser beam. Even with the reflective coating, excessive layer stresses may possibly lead to an undesired deformation of the wafer chuck.

In addition, layer stresses change after introduction into a vacuum as a result of a reduction in the water content of the layers. Changes in the layer stress of the order of magnitude of a few MPa can still be observed for several days after introduction into a vacuum. Such a long-term change in the layer stress in vacuum necessitates frequent re-calibration of the wafer-chuck positioning.

In order to reduce the stresses on a titanium nitride layer or a titanium layer of a wafer, it is known from U.S. Pat. No. 5,936,307 to roughen a substrate composed of a dielectric material to which that/those layer(s) are applied.

In order to produce a coating having high wear resistance, it is known from JP 61091354 to apply a first thin layer of material to a substrate by ion-plating. A second layer of the same material is applied to the first layer by vapour deposition, the second layer having a tensile stress. A third layer is subsequently applied to the second layer by ion-plating in a reactive gas plasma. The third layer may be composed of titanium nitride, boron nitride, silicon carbide etc. and has a compressive stress.

US 2008/0153010 A1 describes the deposition of a reflective multi-layer coating on a substrate by sputtering. The multi-layer coating applied by sputtering has a layer stress which results in deformation of the substrate. In order to compensate for that deformation, the multi-layer coating is applied to a substrate which is deformed in the opposite direction so that, after the application of the multi-layer coating, the desired flat shape of the substrate with the coating results. In order to achieve deformation of the substrate, it is proposed, inter alia, to support the substrate on a wafer chuck having a curved surface.

U.S. Pat. No. 7,220,319 B2 discloses a wafer chuck having a substrate composed of a conductive material to which an electrode is fixed by screws. The electrode is delimited at the top by a first layer, the thermal expansion coefficient of which lies between that of a dielectric plate on which the wafer is supported, and the expansion coefficient of the electrode. Arranged between the electrode and the substrate is a second layer, the thermal expansion coefficient of which likewise lies between that of the dielectric layer and that of the substrate. The aim of this choice of thermal expansion coefficient is supposed to be that the layer stress of the electrode acts in an opposite manner to the layer stresses of the two layers enclosing the electrode.

JP 2001-223 261 A describes an electrostatic wafer chuck in the case of which three layers having different thermal expansion coefficients are applied between an electrically conductive substrate and an insulating covering layer in order to obtain gradual adaptation between the expansion coefficient of the substrate and the expansion coefficient of the covering layer.

Adaptation of the thermal expansion coefficient between an electrode and a dielectric plate in a wafer chuck is also known from U.S. Pat. No. 7,220,319 B2. The electrode is there arranged between a covering layer and a moderation layer, each of the thermal expansion coefficients of which lies between those of the electrode and of the dielectric plate.

OBJECTS OF AND SUMMARY OF THE INVENTION

An object of the invention is to provide a wafer chuck with a coating which exhibits low deformation preferably even after the wafer chuck is introduced into a vacuum.

This object is achieved, in one formulation, by a wafer chuck of the type mentioned in the introduction, in the case of which the coating has at least a first layer under compressive stress and at least a second layer under tensile stress for compensating for the compressive stress of the first layer.

According to another formulation, it is proposed to compensate as fully as possible for the compressive stress of the first layer, which is applied, for example, by sputtering, by at least one further layer which has a tensile stress. The material of the second layer, its thickness and the type of application are so selected that the substrate-deforming effect of the tensile stress of the second layer is compensated for to the greatest extent possible by the opposite effect of the compressive stress of the first layer. It is thus possible to obtain a wafer chuck having a coating which is free from deformation overall, thereby enabling deformation of the wafer chuck substrate to which the coating is applied to be prevented. This procedure can be applied both to the electrically conductive coating and to the reflective coating; in the latter case it is optionally also possible to dispense with such compensation in individual cases, for example when the total thickness of the coating is very small.

In one embodiment, the material of the first layer is selected from the group comprising: nitrides, carbides and silicides. Materials from those substance groups generally have a high degree of hardness and therefore a high degree of scratch resistance which is especially favourable for the present applications.

In a further embodiment, the material of the first layer of the electrically conductive coating is selected from the group comprising: titanium nitride (TiN), chromium nitride (CrN), molybdenum silicide ($MoSi_2$), silicon carbide (SiC) and silicon nitride ($Si_3N_4$). In particular, titanium nitride and chromium nitride have proved to be especially suitable layer materials for the covering layer of the coating owing to their strength properties.

In a further embodiment, the second layer of the electrically conductive coating has a tensile stress of from 100 MPa to 1600 MPa, preferably from 800 MPa to 1300 MPa. As stated above, in order to compensate for the high compressive stresses, such as are typically produced when sputtering the first layer, it is necessary to generate considerable tensile stress with the aid of the second layer. The second layer may be composed of a metal, especially chromium, which is applied to the substrate by thermal evaporation, tensile stresses of typically from 800 MPa to 1300 MPa being reached. Using chromium as the layer material has the advantage that, for example, even a small layer thickness of from 40 nm to 80 nm is sufficient to compensate for the substrate deformation of a covering layer from 50 nm to 100 nm thick with 1 GPa compressive stress. It will be appreciated, however, that it is also possible to use for the second layer other layer materials suitable for generating sufficient tensile stress. Examples of such materials are metallic titanium, zirconium or hafnium.

The inventors have found that it is advantageous if the second layer of the electrically conductive coating is formed from a material having a higher electrical conductivity than the material of the first layer. In that case, the maximum permitted surface resistance of the conductive coating used as the electrode can be adhered to without having to apply the first layer with excessive thickness. This is especially advantageous if the first layer forms cracks or becomes detached from the substrate or from the second layer owing to too great a line stress with too thick an application. The surface resistance can also be reduced with respect to a single first layer when the second layer is of lower electrical conductivity than the first layer if the total thickness of the electrically conductive layer stack increases.

In a further embodiment, the first layer of the electrically conductive coating has a thickness of less than 200 nm, preferably less than 100 nm, especially less than 50 nm. As stated above, it is possible, especially when using a second layer having an electrical conductivity greater than that of the first layer, to select the thickness of the first layer to be smaller than would be possible when using a single conductive layer.

As a rule, the substrate is composed of a non-conductive material, especially Zerodur. The layer material of the second layer is so selected that it has the best possible adhesion properties on the non-conductive material, or on Zerodur. As a rule, this is the case when the second layer has a high chemical binding affinity towards the substrate material. It will be appreciated that the material of the second layer may also be so selected that the second layer acts as an adhesion promoter layer for the first layer. This is ensured especially when the first layer is composed of a nitride, carbide or silicide of a material which is also contained in the second layer, for example when chromium is selected as the material of the second layer and chromium nitride is selected as the material of the first layer.

In one embodiment, the first layer is applied to the second layer, that is to say, the first layer, which has a compressive stress, is arranged above the second layer, which has a tensile stress. The first layer is here typically the covering layer of the coating and is brought into contact with the wafer, or the wafer table, while the second layer is used to compensate for the layer stress of the first layer.

In a further embodiment, the first layer of the electrically conductive coating is formed by sputtering, especially with ion assistance, and the second layer is formed by thermal evaporation. Typically, the sputtering of a material generates a compressive stress in the layer of material produced, while thermal evaporation gives rise to a tensile stress, the degree of compressive or tensile stress also depending on the type of material applied and on the process parameters: rate of vapour deposition, gas pressure and gas composition during the vapour deposition process and the selected sputtering process. The ion assistance imparted to the growing layer is used to increase the layer hardness and to influence in a targeted manner the layer roughness and thus the friction coefficient of the layer surface.

It has been found that the layer stresses both of the electrically conductive coating and of the reflective coating may change when the wafer chuck is operated under vacuum conditions owing to the escape of water which has become embedded in the layer structure beforehand when the wafer chuck was being stored in air. Since the escape of water from the coatings under vacuum conditions takes place only relatively slowly, the layer stress and therefore the surface evenness of the wafer chuck likewise change only relatively slowly. The time taken for the layer stress to become sufficiently stabilised may be in the region of several days. If it is desired to bring the wafer chuck back into operation after the ventilation of a vacuum environment, for example in an EUV lithography system, it is therefore necessary either to wait until the layer stress has stabilised or to accept a deterioration of the overlay with several consecutive exposure steps.

In one embodiment, the electrically conductive and/or reflective coating is formed from metallic layer materials and/or from dielectric layer materials deposited with ion assistance. The inventor recognised that the change in the mechanical layer stresses of layer materials in vacuum can be reduced if those materials incorporate only a little or no water in their layer structure. A suitable metallic layer material for the electrically conductive coating is the above-mentioned chromium. In the case of the reflective coating, aluminium and silver have proved to be especially suitable layer materials which may be used, for example, as the lowermost mirror layer of the reflective coating.

In addition to metallic layer materials, it is also possible to use, for example, dielectric layer materials having low porosity since only a small amount of water can become embedded in low-porosity layers. Dielectric layers applied by ion-assisted deposition, for example using an Advanced Plasma Source (APS) as the ion beam source, have proved to be especially suitable. Examples of layer materials which are mechanically stress-stable in vacuum, in the case of an electrically conductive coating, are especially titanium nitride (TiN) and chromium nitride (CrN) which are preferably vapour-deposited under nitrogen ion bombardment. Suitable layer materials for the reflective coating which are stress-stable in a vacuum environment are especially materials selected from the group: titanium dioxide ($TiO_2$), silicon dioxide ($SiO_2$), hafnium dioxide ($HfO_2$) and zirconium dioxide ($ZrO_2$). Those oxidic materials are preferably manufactured under ion bombardment, the use of argon or oxygen ions in particular having proved to be especially advantageous.

In one embodiment of the wafer chuck, the electrically conductive and/or the reflective coating has a water-impermeable sealing layer as the terminal layer. The use of such a sealing layer represents a further possibility for reducing the change in the water content and therefore the change in the mechanical layer stress of, in particular, dielectric layers in vacuum.

The thickness of the sealing layer may be so selected that it directly increases the reflection of the coating. In that case, the optical layer thickness is typically one quarter of the working wavelength for which the reflective coating is designed. The working wavelength here typically corresponds to the wavelength of the laser beam used for positioning and may be, for example, 633 nm. The sealing layer may, however, also be optically inactive, that is to say, the reflection of the coating is at least not impaired by the sealing layer. This can be achieved either by a very small layer thickness of only a few nanometres or by an optical layer thickness of an integral multiple of half the working wavelength. Examples of such a sealing layer are thin organic layers (for example of Optron, Teflon AF) and hydrophobic layers which can be produced, for example, with a CVD process. Terminal layers, for example of silicon dioxide, produced with ion beam assistance or a sputtering process (for example magnetron sputtering, ion beam sputtering) may likewise have a sealing effect.

In a further embodiment, the electrically conductive coating has a total thickness of less than 300 nm and the reflective coating has a total thickness of less than 400 nm. A small total thickness of the coating is favourable since the change in the deformation of the substrate depends on the line stress, that is to say, the product of layer stress and layer thickness. It is thus also possible to reduce the change in the deformation of a wafer chuck for EUV applications after introduction into a vacuum by keeping the layer thickness of the electrically conductive coating and/or of the reflective coating as small as possible. This means for the electrically conductive coating that layer materials having as high an electrical conductivity as possible should be selected (for example, titanium nitride instead of chromium nitride). In order in the case of the reflective coating to achieve as small a total thickness as possible with a high degree of reflection, the layer materials used should have as large a refractive index difference as possible at the working wavelength. At a working wavelength of, for example, 633 nm, it is possible to use instead of hafnium dioxide, for example, titanium dioxide as a highly refractive layer material because it has a higher refractive index than hafnium dioxide.

In addition to or as an alternative to the procedure described above, the second layer, which is under tensile stress, may be in a form such as to compensate substantially for a stress change, caused by a loss of water in a vacuum environment, in the first layer, which is under compressive stress. In that case, a coating is used, the individual layers of which have different stress changes when water is lost. There is less of a change in the total stress of the coating when water is lost if, for example, there are present both layers which increase their layer stress through water loss and layers which reduce their layer stress through water loss. A lesser change in the total stress of a coating is likewise obtained when some of the layers increase or reduce their tensile stress through water loss, while other layers increase or reduce their compressive stress to the same extent. Typically, the loss of water in the materials described here will result either in a reduction in a compressive stress or in an increase in a tensile stress, but, with a suitable choice of layer morphology and layer chemistry, water embedded in the layer structure can also, for example, bring about a tensile stress which decreases when water is lost.

Further features and advantages of the invention will emerge from the following description of embodiments of the invention, with reference to the Figures of the drawings which show details essential for the invention, and from the claims. The individual features may be implemented individually or together in any combination in a variant of the invention.

BRIEF DESCRIPTION OF THE DRAWINGS

Embodiments are shown in the schematic drawings and are explained in the following description.

DETAILED DESCRIPTION OF EXEMPLARY EMBODIMENTS

Figure 1:
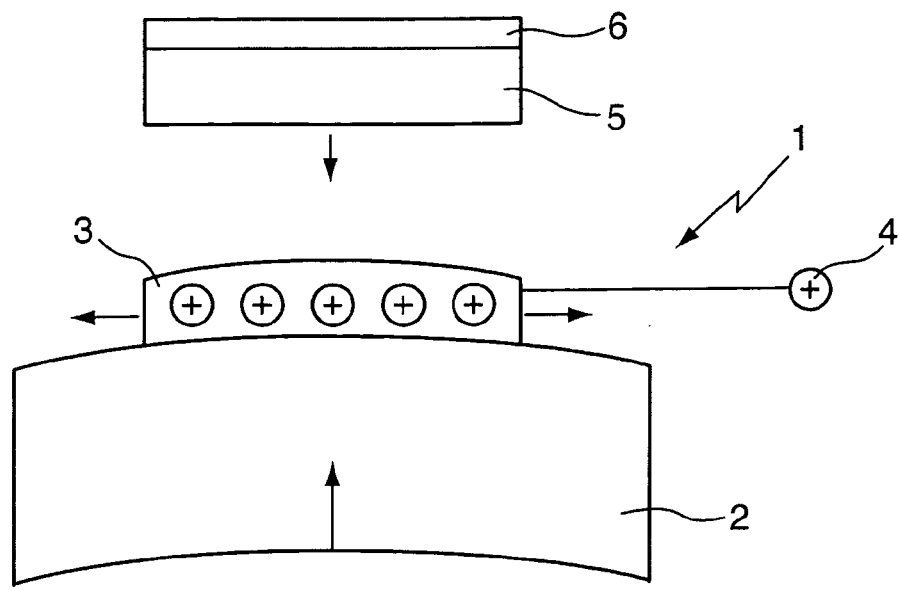
FIG. 1 is a schematic view of a wafer chuck having an electrically conductive coating with a single layer under compressive stress.

FIG. 1 shows schematically a wafer chuck 1 for EUV lithography which has a substrate 2 of Zerodur to which a coating having a single first layer 3 composed of an electrically conductive scratch-resistant material is applied. Suitable layer materials for the first layer 3 are nitrides, especially titanium nitride (TiN), silicon nitride ($Si_3N_4$) or chromium nitride (CrN), but also carbides, for example silicon carbide (SiC) and optionally also silicides, for example molybdenum silicide ($MoSi_2$).

The electrically conductive layer 3 acts as an electrode and is connected to a voltage source 4 in order to keep the layer 3 at a positive potential. A wafer 6 supported on a wafer table 5 composed of a dielectric material or a glass ceramic, such as Zerodur or cordierite, can thus be fixed to the wafer chuck 1 by electrostatic attraction. The fixing of the wafer 6 by electrostatic attraction is the norm when using the wafer chuck 1 in EUV lithography since the EUV lithography systems used there are operated under vacuum conditions, so that it is not generally possible to fix the wafer 6 by vacuum suction.

The layer 3 is applied by a sputtering process which results in the layer 3 having a high mechanical compressive stress which may possibly lie at 1 GPa or above. Such a compressive stress can lead to a deformation of the layer 3 and of the substrate 2 which is so great that the requirements in respect of the evenness of the substrate 2 are no longer fulfilled, as shown in a greatly exaggerated representation in FIG. 1.

Figure 2:
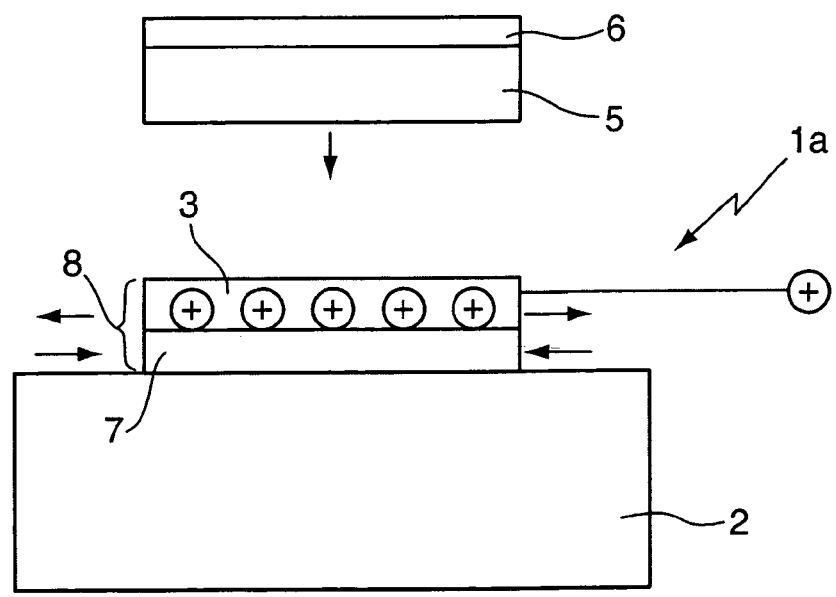
FIG. 2 is a schematic view of an embodiment of a wafer chuck according to the invention in which a second layer, which is under tensile stress, is applied below the first layer.

As shown in FIG. 2, using a further wafer chuck 1*a*, such a deformation can be prevented in an effective manner by introducing between the substrate 2 and the first layer 3 having the mechanical compressive stress a second layer 7 which has a mechanical tensile stress. The layer thickness and the material of the second layer 7 are in an ideal case so selected that the tensile stress thereof just compensates for the compressive stress of the first layer 3, so that the coating 3, 7 is stress-free overall and the substrate 2 is not deformed by the coating 3, 7.

Suitable layer materials for the second layer are metallic materials, especially chromium, since it has a high electrical conductivity and, when suitably applied, a high tensile stress. If chromium is deposited on the substrate 2, for example, by thermal evaporation, the thickness of the chromium layer should be so selected that the product of layer thickness and layer stress, which, in the case of chromium, is from 800 MPa to 1300 MPa, depending on the degree of oxidation, compensates as well as possible for the product of layer stress and layer thickness of the first layer.

It will be appreciated that it is also possible to use other materials apart from chromium for the second layer 7, especially those having a high tensile stress of typically from 100 MPa to 1600 MPa and having good adhesion properties both with respect to the material of the substrate 2, for example Zerodur, and with respect to the material of the first layer 3, so that the second layer 7 can be used as an adhesion promoter layer between the first layer 3 and the substrate 2.

The application of a second layer 7 composed of a material such as chromium which has a higher electrical conductivity than the material of the first layer 3 which is composed, for example, of chromium nitride, is favourable since in that case the thickness of the first layer 3 can be reduced and the necessary low surface resistance of the coating 3, 7 of a maximum of approximately 100 to 200 Ohm is nevertheless not exceeded. This is especially favourable in cases where the material of the first layer 3, for example titanium nitride or chromium nitride, forms cracks or becomes detached from the substrate 2 owing to too high a line stress with too great a thickness (typically more than approximately 200 nm).

It will be appreciated that, in contrast to what has been described above, the electrically conductive coating may also have more than two layers, the layer stresses of which are so selected that tensile and compressive stresses in the coating as a whole just compensate for each other.

Figure 3:
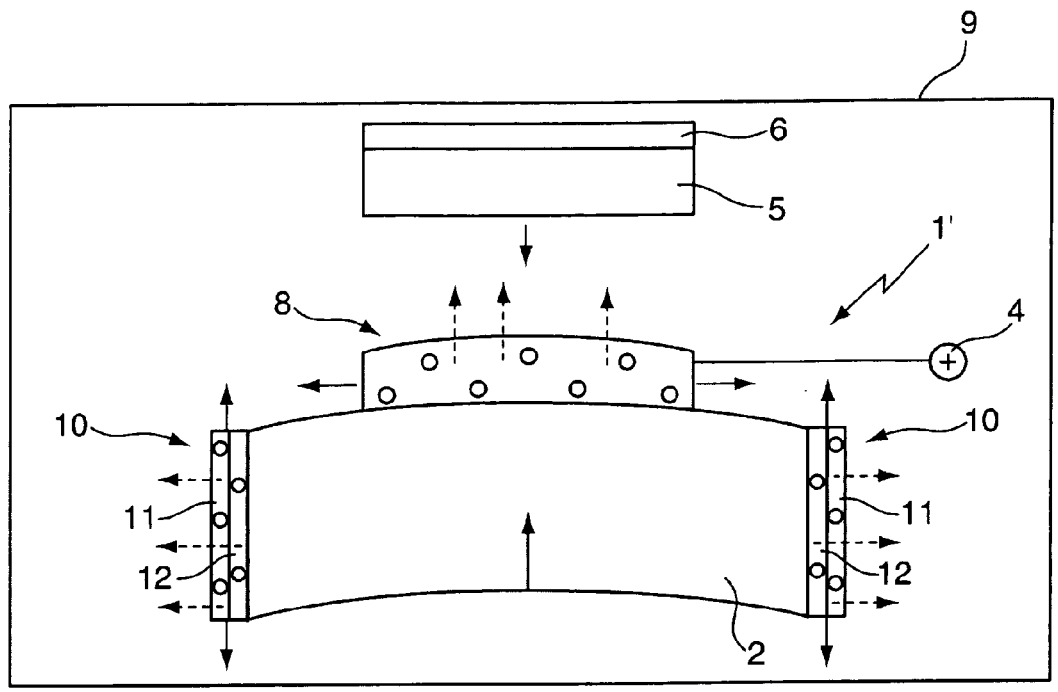
FIG. 3 is a schematic view of a wafer chuck having an electrically conductive coating and a reflective coating in a vacuum environment.

The use of more than two layers is especially typical of a reflective coating 10, as formed on the side faces of the substrate 2 of a wafer chuck 1' shown in FIG. 3. The reflective coating 10 is here used for the precise positioning of the wafer chuck 1' using a laser beam (not shown) directed onto the coating 10 and reflected from there. FIG. 3 shows by way of example the reflective coating 10 with only one first layer 11 and one second layer 12. It will be appreciated, however, that the reflective coating 10 may also have a plurality of layers, typically having an alternating high and low refractive index. The layer materials and layer thicknesses of the layers 11, 12 are so selected that any compressive stress of the first layer 11 is substantially compensated for by a tensile stress of the second layer 12, which is especially readily possible, for example, when using silicon dioxide and titanium dioxide as layer materials. It will be appreciated that the layer materials and layer thicknesses of the layers 11, 12 should be so selected that the latter meet optical requirements, especially with regard to reflectivity; in addition, stress compensation of the layers 11, 12 should be effected. It will be appreciated that it is optionally also possible to dispense with stress compensation in the case of the reflective coating 10, especially when that coating has a small layer thickness. In that case too, however, a change in the layer stress of the reflective coating 10 should be avoided when introducing the wafer chuck 1' into a vacuum, as explained in more detail hereinafter.

Although in the case of the wafer chuck 1' shown in FIG. 3, the tensile and compressive stresses substantially compensate for each other both on the electrically conductive coating 8 and on the reflective coating 10, deformation of the wafer chuck 1' nevertheless occurs, as shown in FIG. 3, in a vacuum chamber/environment 9 which may be formed in the present case, for example, by an evacuated housing part of an EUV lithography system.

Such deformation takes place as a result of the fact that the layer stresses, both of the electrically conductive coating and of the reflective coating, change when the wafer chuck is operated under vacuum conditions as a result of the escape of water (illustrated in FIG. 3 by circles) which has become embedded beforehand in the layers 3, 7 and 11, 12 of the coatings 8, 10, respectively. Since the escape of water (cf. broken arrows) from the coatings 8, 10 takes place only relatively slowly under vacuum conditions, the deformation of the wafer chuck 1' changes in a time-dependent manner until a steady state is established, which may possibly not be achieved until after several days.

In order to be able to use a wafer chuck as quickly as possible under vacuum conditions, it is necessary to provide an arrangement thereon which effectively prevents or at least reduces a loss of water from the coatings 8, 10 in the vacuum chamber 9. Several possibilities in this respect are described by way of example in connection with a wafer chuck 1*b* shown in FIG. 4.

In the case of the electrically conductive coating 8, deformation can be prevented, for example, by using layer materials which incorporate only a small amount of water. Suitable layer materials for the first layer 3 are in this case especially titanium nitride (TiN) or chromium nitride (CrN) which are vapour-deposited, for example, under nitrogen ion bombardment and, as a result, have only a low porosity. A metal layer, for example a chromium layer, may be used as the second layer 7 since metals generally incorporate only small amounts of water.

Figure 4:
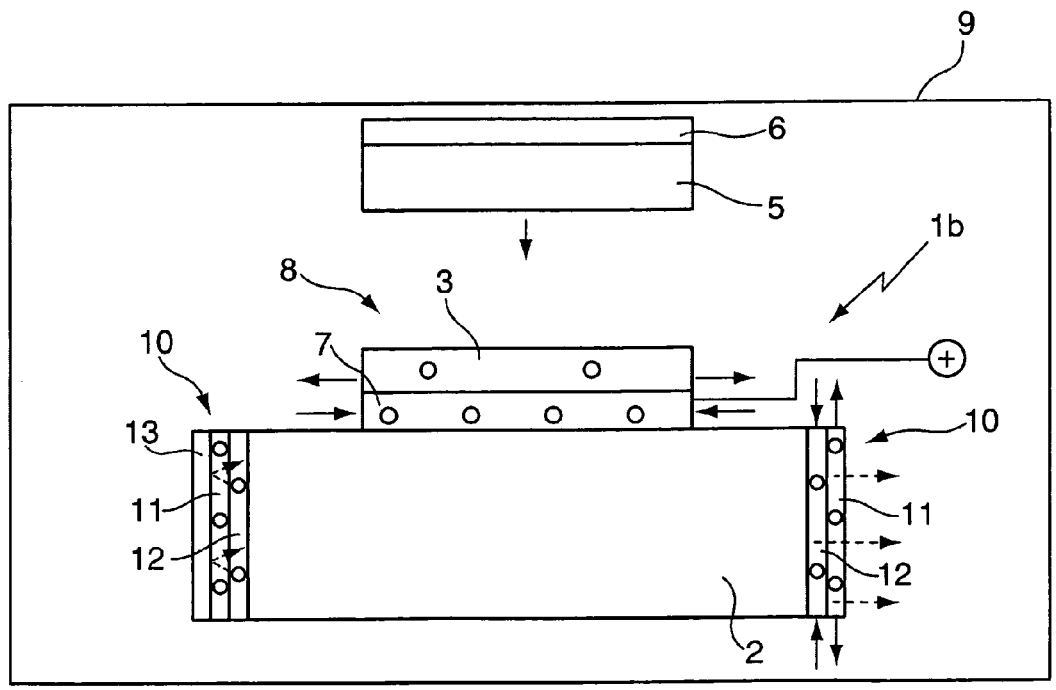
FIG. 4 is a schematic view of an embodiment of a wafer chuck according to the invention and configured to prevent a change in stress in the coatings caused by loss of water in the vacuum environment.

In the case of the reflective coating 10 shown on the left-hand side of FIG. 4, a water-impermeable sealing layer 13 is applied to the layers 11, 12 as a terminal layer and prevents water from passing through. For example, thin, organic layers (Optron, Teflon AF) and hydrophobic layers, which are produced, for example, using a CVD process, may be used as the sealing layer 13. A sealing effect may likewise be generated by terminal layers, for example of silicon dioxide, that are produced with ion beam assistance or a sputtering process (magnetron sputtering, ion beam sputtering). The thickness of the sealing layer 13 may here be so selected that this layer contributes to the reflection of the coating 10 (for example, when a layer thickness which amounts to one quarter of the working wavelength is selected) or is optically inactive (for example, when a particularly small layer thickness is selected or in the case of a layer thickness with an integral multiple of half the working wavelength).

In the case of the reflective coating 10 shown on the right-hand side of FIG. 4, deformation of the substrate 2 is prevented by the second layer 12 being in a form such as to compensate for a change in stress in the first layer 11 caused by the loss of water. This can be achieved when the layers 11, 12 differ from one another in their stress behaviour, that is to say, when, for example, on the loss of water, the compressive stress of the first layer 11 decreases and the tensile stress of the second layer 12 also decreases to the same extent.

Of course, in the case of the reflective coating 10 too, changes in the layer stress can be compensated for by selecting layer materials which can incorporate only small quantities of water. This is the case, for example, of metallic layer materials such as aluminium (Al) or silver (Ag) which may be used as the lowermost layer (mirror face) of the reflective coating 10.

One or more layers of a preferably, typically, oxidic layer material may be applied to that metallised face in order to increase reflection, for example titanium dioxide ($TiO_2$), silicon dioxide ($SiO_2$), hafnium dioxide ($HfO_2$) or zirconium dioxide ($ZrO_2$). If the deposition of those dielectric materials takes place with ion assistance, especially using oxygen ions or argon ions, the porosity of those layers can be reduced to such an extent that only small amounts of water can become embedded in the layer structure thereof.

Additionally or alternatively, the change in the deformation of the substrate 2 in the vacuum chamber 9 can also be reduced by selecting the total thickness of the coating 8, to be as small as possible since it depends on the line stress, that is to say, the product of layer stress and layer thickness. This can be achieved, for example, in the case of the electrically conductive coating 8 by, in addition to using chromium as the layer material for the second layer 7, also selecting for the first layer 3 a layer material having a high electrical conductivity, for example titanium nitride, so that the electrically conductive coating 8 can be manufactured with a total thickness of less than 300 nm.

It is also possible to reduce the total thickness of the reflective coating 10 by selecting layer materials that have as great as possible a difference in refractive index, for example, when, at a working wavelength of the laser beam used for positioning of 633 nm, titanium dioxide (refractive index n of approximately 2.2-2.3) is used instead of hafnium dioxide (refractive index n of approximately 1.9-2.0). A reflective coating 10 having a total thickness of less than 400 nm can thus be obtained.

In any case, a wafer chuck with an electrically conductive coating having high scratch resistance, good electrical conductivity and negligibly small stresses can be obtained in the manner described above. Likewise, a reflective coating having only slight stresses can be obtained in the manner described above. In particular, changes in the layer stress of the two coatings caused by the escape of water in a vacuum environment can be compensated for or avoided in the manner proposed above.

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

The invention claimed is:

1. A wafer chuck comprising:
a substrate and
applied to the substrate, an electrically conductive coating for fixing a wafer by electrostatic attraction, wherein:
the electrically conductive coating comprises at least a first layer under compressive stress, and at least a second layer under tensile stress compensating for the compressive stress of the first layer, and
the electrically conductive coating has a total thickness of less than 300 nm.

2. The wafer chuck according to claim 1, wherein the material of the first layer of the electrically conductive coating comprises: nitrides, carbides and silicides.

3. The wafer chuck according to claim 2, wherein the material of the first layer of the electrically conductive coating is selected from the group consisting of: titanium nitride (TiN), chromium nitride (CrN), molybdenum silicide ($MoSi_2$), silicon carbide (SiC) and silicon nitride ($Si_3N_4$).

4. The wafer chuck according to claim 1, wherein the second layer of the electrically conductive coating has a tensile stress of from 100 MPa to 1600 MPa.

5. The wafer chuck according to claim 4, wherein the second layer of the electrically conductive coating has a tensile stress of from 800 MPa to 1300 MPa.

6. The wafer chuck according to claim 1, wherein the second layer of the electrically conductive coating is composed of a metal.

7. The wafer chuck according to claim 6, wherein the second layer of the electrically conductive coating is composed of chromium.

8. The wafer chuck according to claim 1, wherein the second layer of the electrically conductive coating is formed from a material having a higher electrical conductivity than the material of the first layer.

9. The wafer chuck according to claim 1, wherein the first layer of the electrically conductive coating has a thickness of less than 200 nm.

10. The wafer chuck according to claim 9, wherein the first layer of the electrically conductive coating has a thickness of less than 50 nm.

11. The wafer chuck according to claim 1, wherein the substrate is composed of a non-conductive material.

12. The wafer chuck according to claim 11, wherein the substrate is composed of Zerodur.

13. The wafer chuck according to claim 1, wherein the first layer of the electically conductive coating is applied to the second layer.

14. The wafer chuck according to claim 1, wherein the first layer of the electrically conductive coating is formed by sputtering and the second layer is formed by thermal evaporation.

15. The wafer chuck according to claim 14, wherein the first layer of the electrically conductive coating is formed by sputtering with ion assistance.

16. The wafer chuck according to claim 1, wherein the electically conductive coating is formed from at least one of metallic layer materials and dielectric layer materials deposited with ion assistance.

17. The wafer chuck according to claim 1, wherein the electrically conductive coating has a water-impermeable sealing layer.

18. The wafer chuck according to claim 1, wherein the second layer of the electrically conductive coating is in a form such as to compensate for a change in stress in the first layer of the electrically conductive coating caused by the loss of water in a vacuum environment.

19. The wafer chuck according to claim 1, further comprising a reflective coating applied to a side surface of the substrate, wherein:
the electrically conductive coating is applied to a top surface of the substrate, and
the reflective coating comprises at least a first layer under compressive stress, and at least a second layer under tensile stress compensating for the compressive stress of the first layer.

20. The wafer chuck according to claim 19, wherein the reflective coating comprises at least one metallic layer material.

21. The wafer chuck according to claim 20, wherein the at least one metallic layer material is aluminium (Al) or silver (Ag).

22. The wafer chuck according to claim 19, wherein the reflective coating has at least one layer material deposited which is selected from the group comprising: titanium dioxide ($TiO_2$), silicon dioxide ($SiO_2$), hafnium dioxide ($HfO_2$) and zirconium dioxide ($ZrO_2$).

23. The wafer chuck according to claim 22, wherein the at least one layer material is deposited with ion assistance.

24. The wafer chuck according to claim 19, wherein the reflective coating has a total thickness of less than 400 nm.

25. The wafer chuck according to claim 19, wherein the first layer of the reflective coating is applied to the second layer.

26. The wafer chuck according to claim 19, wherein the reflective coating is formed from at least one of metallic layer materials and dielectric layer materials deposited with ion assistance.

27. The wafer chuck according to claim 19, wherein the reflective coating comprises a water-impermeable sealing layer.

28. The wafer chuck according to claim 19, wherein the second layer of the reflective coating is in a form such as to compensate for a change in stress in the first layer of the reflective coating caused by the loss of water in a vacuum environment.

* * * * *

UNITED STATES PATENT AND TRADEMARK OFFICE
CERTIFICATE OF CORRECTION

| | | |
|---|---|---|
| PATENT NO. | : 8,564,925 B2 | Page 1 of 1 |
| APPLICATION NO. | : 13/163100 | |
| DATED | : October 22, 2013 | |
| INVENTOR(S) | : Stephan Six | |

It is certified that error appears in the above-identified patent and that said Letters Patent is hereby corrected as shown below:

In the Specifications:

Column 9, Line 21: delete "8," and insert -- 8, 10 --

In the Claims:

Column 10, Line 39: In Claim 13, delete "electically" and insert -- electrically --

Column 10, Line 48: In Claim 16, delete "electically" and insert -- electrically --

Signed and Sealed this
Sixth Day of May, 2014

Michelle K. Lee
*Deputy Director of the United States Patent and Trademark Office*